(12) United States Patent
Sagawa et al.

(10) Patent No.: US 8,922,461 B2
(45) Date of Patent: Dec. 30, 2014

(54) DISPLAY DEVICE

(75) Inventors: Hiroshi Sagawa, Kanagawa (JP);
Tetsuro Yamamoto, Kanagawa (JP);
Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 554 days.

(21) Appl. No.: 12/431,382

(22) Filed: Apr. 28, 2009

(65) Prior Publication Data

US 2009/0273548 A1 Nov. 5, 2009

(30) Foreign Application Priority Data

Apr. 30, 2008 (JP) ................................. 2008-118891
Mar. 11, 2009 (JP) ................................. 2009-057788

(51) Int. Cl.
*G09G 3/30* (2006.01)
*H01L 27/32* (2006.01)
*G09G 3/32* (2006.01)

(52) U.S. Cl.
CPC .......... *H01L 27/3262* (2013.01); *G09G 3/3225* (2013.01); *G09G 2300/0842* (2013.01); *G09G 2300/0452* (2013.01); *G09G 2300/0426* (2013.01)
USPC .............................................. 345/76; 257/72

(58) Field of Classification Search
CPC ..................... G09G 3/3225; G09G 2300/0426; G09G 2300/0452; H01L 27/3262
USPC .......... 345/76, 77, 83, 84, 90, 92, 93; 257/40, 257/59, 66, 72
See application file for complete search history.

(56) References Cited

U.S. PATENT DOCUMENTS

| | | | |
|---|---|---|---|
| 6,583,776 B2 * | 6/2003 | Yamazaki et al. | 345/77 |
| 7,102,282 B1 | 9/2006 | Yamada et al. | |
| 7,750,350 B2 * | 7/2010 | Fischer et al. | 257/72 |
| 7,868,960 B2 * | 1/2011 | Tsubata et al. | 349/43 |
| 2003/0112205 A1 * | 6/2003 | Yamada | 345/32 |
| 2006/0145964 A1 * | 7/2006 | Park et al. | 345/76 |
| 2007/0263164 A1 * | 11/2007 | Kumagai | 349/156 |
| 2008/0017860 A1 * | 1/2008 | Kubota et al. | 257/59 |
| 2008/0029768 A1 * | 2/2008 | Asano et al. | 257/72 |

FOREIGN PATENT DOCUMENTS

JP 2007-041574 2/2007
WO WO 2007097068 A1 * 8/2007

* cited by examiner

*Primary Examiner* — Amare Mengistu
*Assistant Examiner* — Stacy Khoo
(74) *Attorney, Agent, or Firm* — Dentons US LLP

(57) ABSTRACT

A display device includes: a display element including a plurality of sub-elements connected to retention capacities, respectively; a plurality of writing transistors arranged corresponding to the sub-elements, respectively, and writing an image signal to the retention capacities; and a plurality of driving transistors driving the sub-elements, respectively, based on the image signal written through the writing transistors. The writing transistors, the driving transistors or both of them are aligned along a source-drain alignment direction in which a drain electrode and a source electrode of each transistor in the writing transistors and driving transistors are aligned, and the writing transistors, the driving transistors or both of them are arranged so that drain electrodes or source electrodes in a pair of transistors are immediately adjacent to each other, the pair of transistors being a pair of the writing transistors or the driving transistors, and being immediately adjacent to each other.

4 Claims, 11 Drawing Sheets

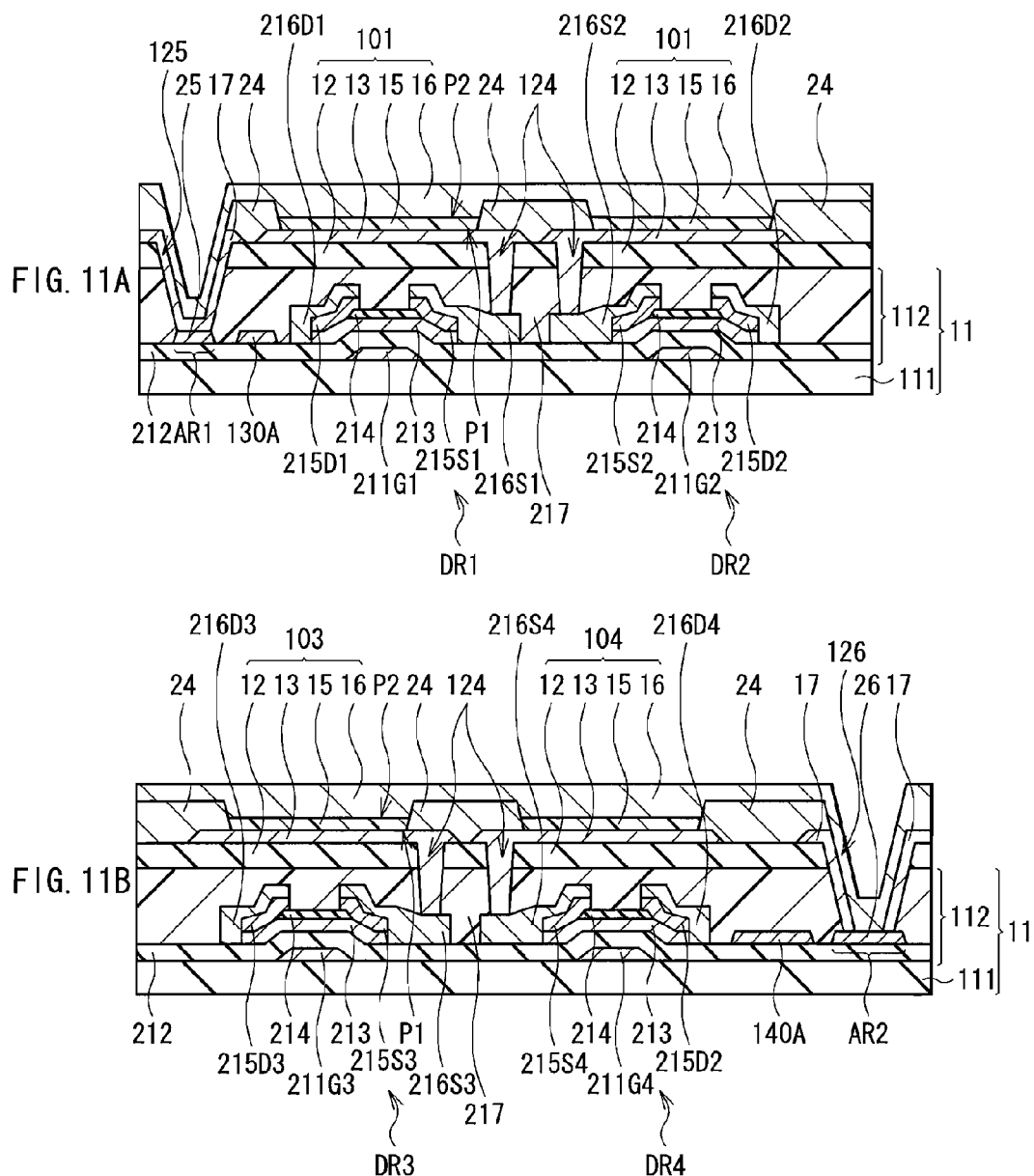

DISPLAY DEVICE

BACKGROUND OF THE INVENTION

1. Field of the Invention

The present invention relates to a display device with a display element including a plurality of sub-elements.

2. Description of the Related Art

In recent years, as a display device replacing a liquid crystal display, an organic EL display using an organic light emitting element has been put into practical use. Since the organic EL display is self-emitting, it has a larger view angle in comparison with a liquid crystal display or the like. Moreover, the organic EL display has sufficient responsiveness to even a high-definition, high-speed video signal.

In an organic light emitting element of the related art, there is an approach to improve display performance. A resonator structure is introduced, and light generated in a light emitting layer is controlled by improving color purity of an emitted color, improving light emission efficiency, or the like. (for example, refer to International Publication WO 01/39554 Pamphlet).

Such an organic EL display includes a driving element such as a thin film transistor driving an organic light emitting element on the basis of an image signal. In such an organic EL display, there is a case where a short circuit occurs between a source electrode and a drain electrode in a driving element, for example, due to a foreign matter mixed during manufacturing process or the like. This may result in that a bright spot defect occurs in an organic light emitting element corresponding to the short circuit. Naturally, when the number of organic light emitting elements having such bright spot defect increases, luminance non-uniformity becomes remarkable, and it is difficult to display a high-definition image.

For this reason, there has been proposed a device in which a plurality of sub-elements constitute one organic light emitting element, and gradation of (remaining) sub-elements except defective sub-elements is corrected by a circuit for correcting light emission gradation arranged in each sub-element (for example, refer to Japanese Unexamined Patent Publication No. 2007-41574).

SUMMARY OF THE INVENTION

However, in Japanese Unexamined Patent Publication No. 2007-41574, there is a case where it is difficult to sufficiently correct the gradation of the sub-elements, and the circuit configuration is complicated so that size reduction of the whole device may be disturbed. Moreover, these days, an area occupied by one pixel has been reduced to obtain higher definition of an image or a picture. With this trend, between driving elements which are immediately adjacent to each other, there is a tendency that a short circuit between electrodes increases due to a mixed foreign matter or the like. Therefore, an organic EL display suitable to an image display with higher definition, and hardly producing a defect during manufacturing process is desirable.

In view of the foregoing, it is desirable to provide a display device capable of exhibiting more favorable display performance without reducing a yield rate during manufacturing process.

According to an embodiment of the present invention, there is provided a display device including: a display element including a plurality of sub-elements connected to retention capacities, respectively; a plurality of writing transistors arranged corresponding to the plurality of sub-elements, respectively, and writing an image signal to the retention capacities; and a plurality of driving transistors driving the sub-elements, respectively based on the image signal written through the plurality of writing transistors. Here, the plurality of writing transistors, the plurality of driving transistors or both of them are aligned along a source-drain alignment direction in which a drain electrode and a source electrode of each transistor in the writing transistors and driving transistors are aligned, and the writing transistors, the driving transistors or both of them are arranged so that drain electrodes or source electrodes in a pair of transistors are immediately adjacent to each other, the pair of transistors being a pair of the writing transistors or the driving transistors, and being immediately adjacent to each other.

In the display device according to the embodiment of the present invention, the plurality of writing transistors, the plurality of driving transistors or both of them are aligned along a source-drain alignment direction in which a drain electrode and a source electrode of each transistor in the writing transistors and driving transistors are aligned, and the writing transistors, the driving transistors or both of them are arranged so that drain electrodes or source electrodes in a pair of transistors are immediately adjacent to each other, the pair of transistors being a pair of the writing transistors or the driving transistors, and being immediately adjacent to each other. Therefore, a semi-dark spot defect or a bright spot defect due to a short circuit between the writing transistors immediately adjacent to each other or the driving transistors immediately adjacent to each other caused by a conductive foreign matter mixed during manufacturing process or the like hardly occurs. Specifically, since electrodes of the different types are arranged relatively apart from each other, probability of the short circuit caused by the mixed conductive foreign matter is reduced. In particular, when electrodes of the same type have electric potential equal to each other, even if the conductive foreign matter is mixed between the electrodes of the same type, it is rare that the writing transistors and the driving transistors operate abnormally. Therefore, improvement of the yield rate is expected even if the display device is highly integrated.

In the display device according to the embodiment of the present invention, a display element includes a plurality of sub-elements, and, corresponding to the plurality of sub-elements, a plurality of writing transistors and a plurality of driving transistors are arranged, respectively. Thus, even in the case where a defect occurs in a part of the sub-elements, the sub-elements as a whole are prevented from a dark spot by adjusting and utilizing the normal sub-elements except the defective sub-elements. Moreover, in a pair of writing transistors which are immediately adjacent to each other and an pair of driving transistors which are immediately adjacent to each other, the electrodes of the same type are arranged closer to each other than the electrode of the different type. Thus, it is possible that occurrence of a semi-dark spot defect or a bright spot defect is suppressed. Therefore, more favorable display performance may be exhibited without reducing the yield rate during manufacturing process.

Other and further objects, features and advantages of the invention will appear more fully from the following description.

BRIEF DESCRIPTION OF THE DRAWINGS

FIGS. 11A and 11B are cross-sectional views illustrating a step subsequent to FIGS. 10A and 10B.

DETAILED DESCRIPTION OF THE PREFERRED EMBODIMENT

A preferred embodiment of the present invention will be described in detail with reference to the accompanying drawings.

Figure 1:
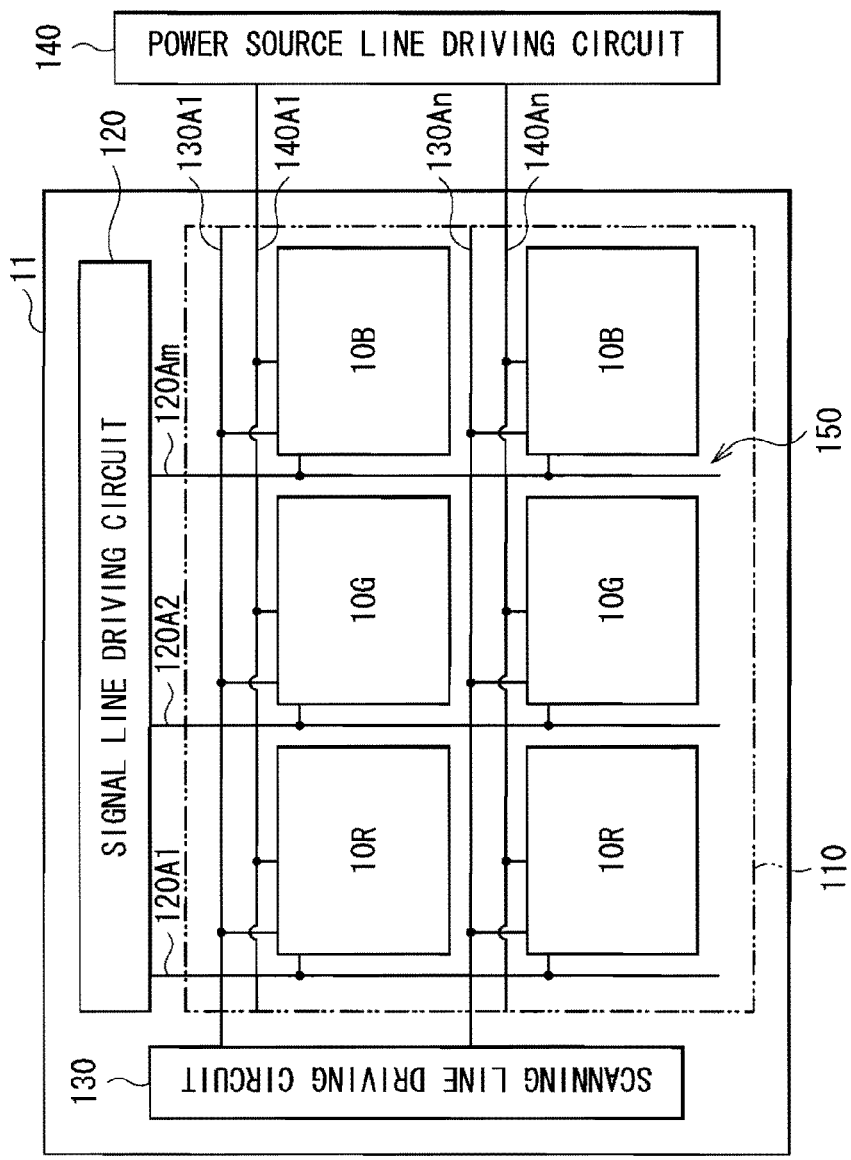
FIG. 1 is a schematic view illustrating the whole configuration of a display device according to a first embodiment of the present invention.

FIG. 1 illustrates the configuration of a display device using an organic light emitting element according to an embodiment of the present invention. This display device is used as an ultra-thin organic light emitting color display device or the like. In the display device, a display region 110 is formed on a substrate 111. On the periphery of the display region 110 on the substrate 111, for example, a signal line driving circuit 120, a scanning line driving circuit 130, and a power supply line driving circuit 140 serving as drivers for an image display are formed.

In the display region 110, a plurality of organic light emitting elements 10 (10R, 10G, and 10B) two-dimensionally arranged in matrix, and a pixel driving circuit 150 driving the organic light emitting elements 10 are formed. In the pixel driving circuit 150, a plurality of signal lines 120A (120A1 to 120Am) are arranged in a column direction, and a plurality of scanning lines 130A (130A1 to 130An) and a plurality of power supply lines 140A (140A1 to 140An) are arranged in a row direction. At each intersection between each signal line 120A and each scanning line 130A, either one of the organic light emitting elements 10R, 10G, and 10B is arranged corresponding to the intersection. Each signal line 120A is connected to the signal line driving circuit 120, each scanning line 130A is connected to the scanning line driving circuit 130, and each power supply line 140A is connected to the power supply line driving circuit 140.

The signal line driving circuit 120 supplies a signal voltage for an image signal according to luminance information supplied from a signal supply source (not shown in the figure) to the selected organic light emitting elements 10R, 10G, or 10B through the signal line 120A.

The scanning line driving circuit 130 is configured with a shift resistor or the like shifting a start pulse in sequence in synchronization with an input clock pulse. At the time of writing an image signal to each of the organic light emitting elements 10R, 10G, and 10B, the scanning line driving circuit 130 scans the organic light emitting elements 10R, 10G, and 10B line-by-line, and supplies the scanned signal to each scanning line 130A in sequence.

The power supply line driving circuit 140 is configured with a shift resistor or the like shifting a start pulse in sequence in synchronization with an input clock pulse. In synchronization with the line-by-line scanning by the scanning line driving circuit 130, the power supply line driving circuit 140 appropriately supplies one of a first electric potential and a second electric potential different from each other to each power supply line 140A. Thereby, a conducting state or a non-conducting state in driving transistors DR1 to DR4 (will be described later) is selected.

Figure 2:
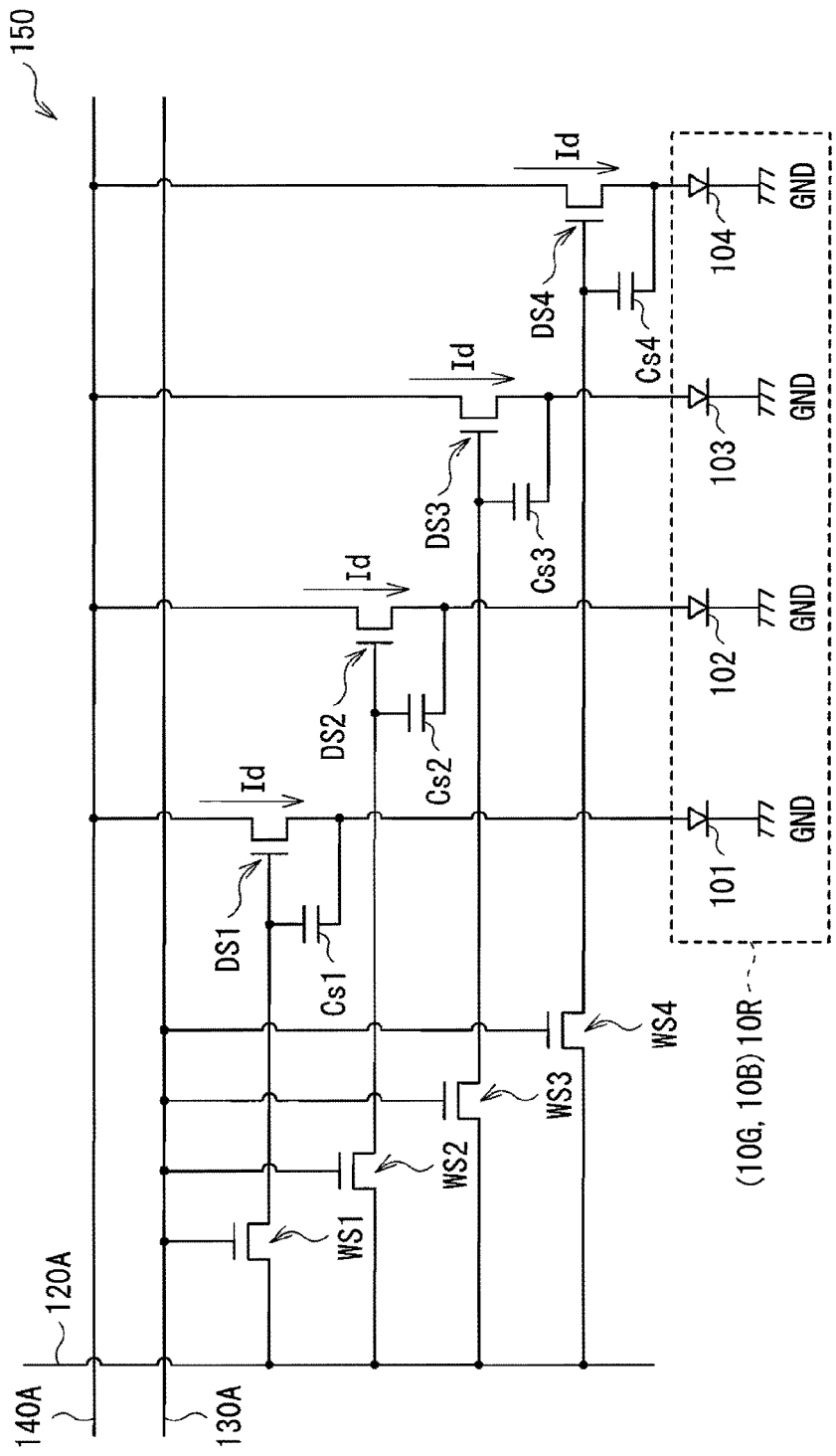
FIG. 2 is a view illustrating an example of a pixel driving circuit shown in FIG. 1.

FIG. 2 illustrates an example of the pixel driving circuit 150. The pixel driving circuit 150 is an active driving circuit including the driving transistors DS1 to DS4 and writing transistors WS1 to WS4, and capacitors (retention capacities) Cs1 to Cs4 between the driving transistors DS1 to DS4 and the writing transistors WS1 to WS4. The organic light emitting element 10R (or 10G or 10B) includes a plurality of partial light emitting regions 101 to 104. The partial light emitting regions 101 to 104 are connected in series to the driving transistors DS1 to DS4, respectively, between the power supply line 140A and common power supply lines (GND). The driving transistors DS1 to DS4 and the writing transistors WS1 to WS4 are configured with a typical thin film transistor (TFT). The structure of the TFT is not specifically limited, and may be an inverted staggered structure (so-called bottom-gate type) or a staggered structure (top-gate type). In addition, it is preferable that the driving transistors DS1 to DS4 and the writing transistors WS1 to WS4 have parameters such as capacitance equal to one another.

In the writing transistors WS1 to WS4, for example, each drain electrode is connected to the signal line 120A, and an image signal from the signal line driving circuit 120 is supplied. Each gate electrode of the writing transistors WS1 to WS4 is connected to the scanning line 130A, and a scanned signal from the scanning line driving circuit 130 is supplied. Moreover, the source electrodes of the writing transistors WS1 to WS4 are connected to the gate electrodes of the driving transistors DS1 to DS4, respectively.

In the driving transistors DS1 to DS4, for example, each drain electrode is connected to the power supply line 140A, and electric potential is set as the first electric potential or the second electric potential by the power supply line driving circuit 140. Each source electrode of the driving transistors DS1 to DS4 is connected to one end of the partial light emitting region 101, 102, 103, or 104, respectively. In the embodiment, although the case where one organic light emitting element 10R (or 10G or 10B) includes the four partial light emitting regions 101 to 104 is described, the number is not limited to four. Any number is arbitrarily selectable as long as it is two or more.

The retention capacities Cs1 to Cs4 are formed between the gate electrodes of the driving transistors DS1 to DS4 (source electrodes of the writing transistors WS1 to WS4) and the source electrodes of the driving transistors DS1 to DS4, respectively.

Figure 3:
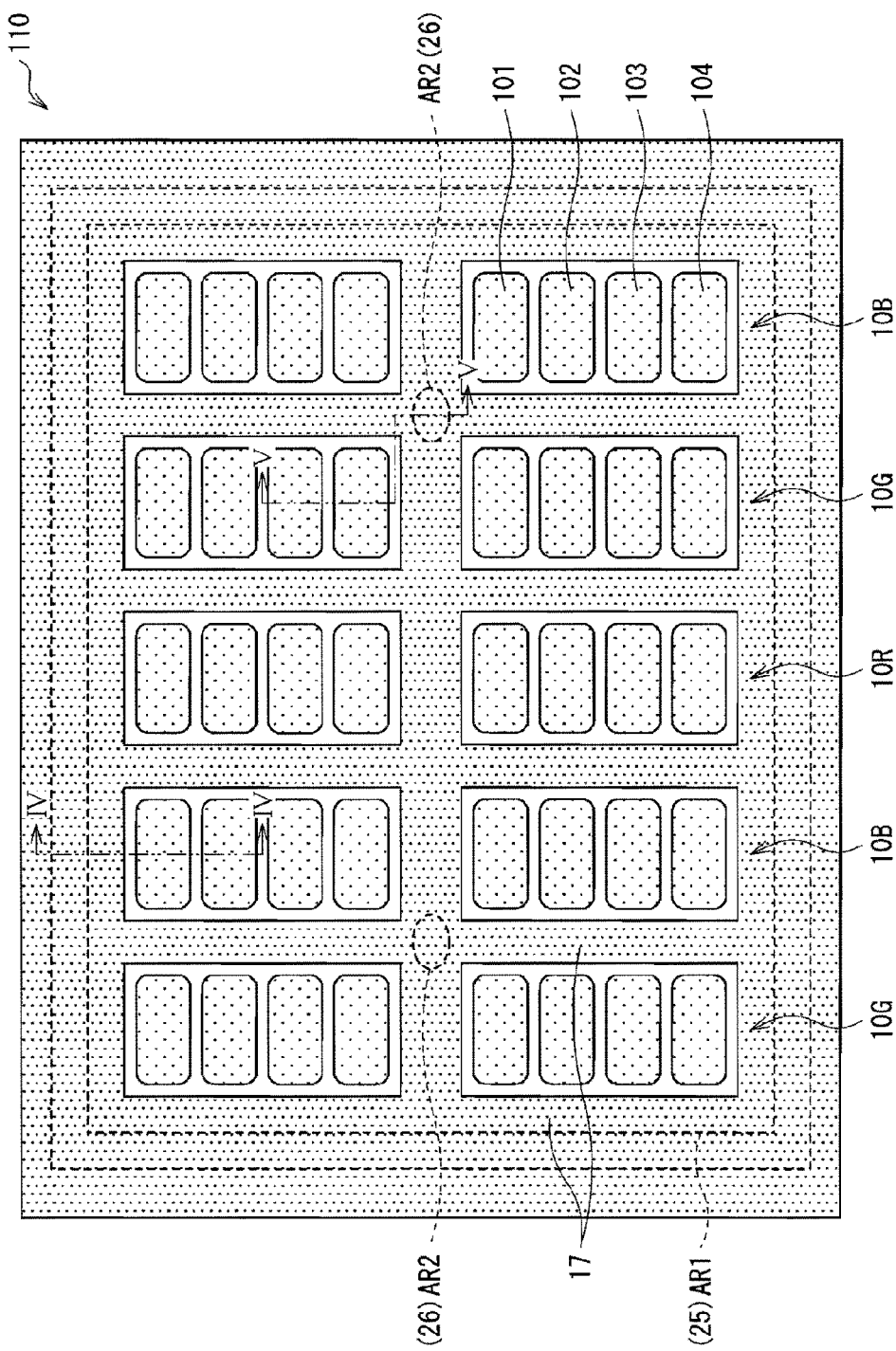
FIG. 3 is a plan view illustrating the configuration of a display region shown in FIG. 1.

FIG. 3 illustrates an example of the plan configuration of the display region 110. In the display region 110, the organic light emitting elements 10R, 10G, and 10B are formed in order in matrix as a whole. Specifically, a metal layer 17 is provided in a lattice pattern, and the partial light emitting regions 101 to 104 in the organic light emitting elements 10R, 10G, and 10B are arranged in order in regions separated by the metal layer 17. The partial light emitting regions 101 to 104 in the organic light emitting element 10R generate red light, the partial light emitting regions 101 to 104 in the organic light emitting element 10G generate green light, and the partial light emitting regions 101 to 104 in the organic light emitting element 10B generate blue light. In addition, a combination of the organic light emitting elements 10R, 10G, and 10B adjacent to one another constitute one pixel. An annular region AR1 and an island-shaped region AR2 indicated with broken lines in FIG. 3 are regions electrically connected to the metal layer 17 and a second electrode layer 16 (will be described later). A metal layer 25 (will be described later) and a metal layer 26 (will be described later) are arranged in a layer level lower than that of the metal layer 17. Although FIG. 3 illustrates the case where there is a total of ten organic light emitting elements 10R (10G, and 10B) (2 columns×5 rows), the number is not limited to this.

Next, with reference to FIGS. 4 to 7, the detailed configuration of the organic light emitting elements 10R, 10G, and 10B arranged on the base 11 will be described. The organic light emitting elements 10R, 10G, and 10B have the configurations similar to one another except that the configuration of an organic layer 15 (will be described later) is partially different. Hereinafter, for the description of the common parts, the organic light emitting element OR will be used as a representative example.

Figure 4:
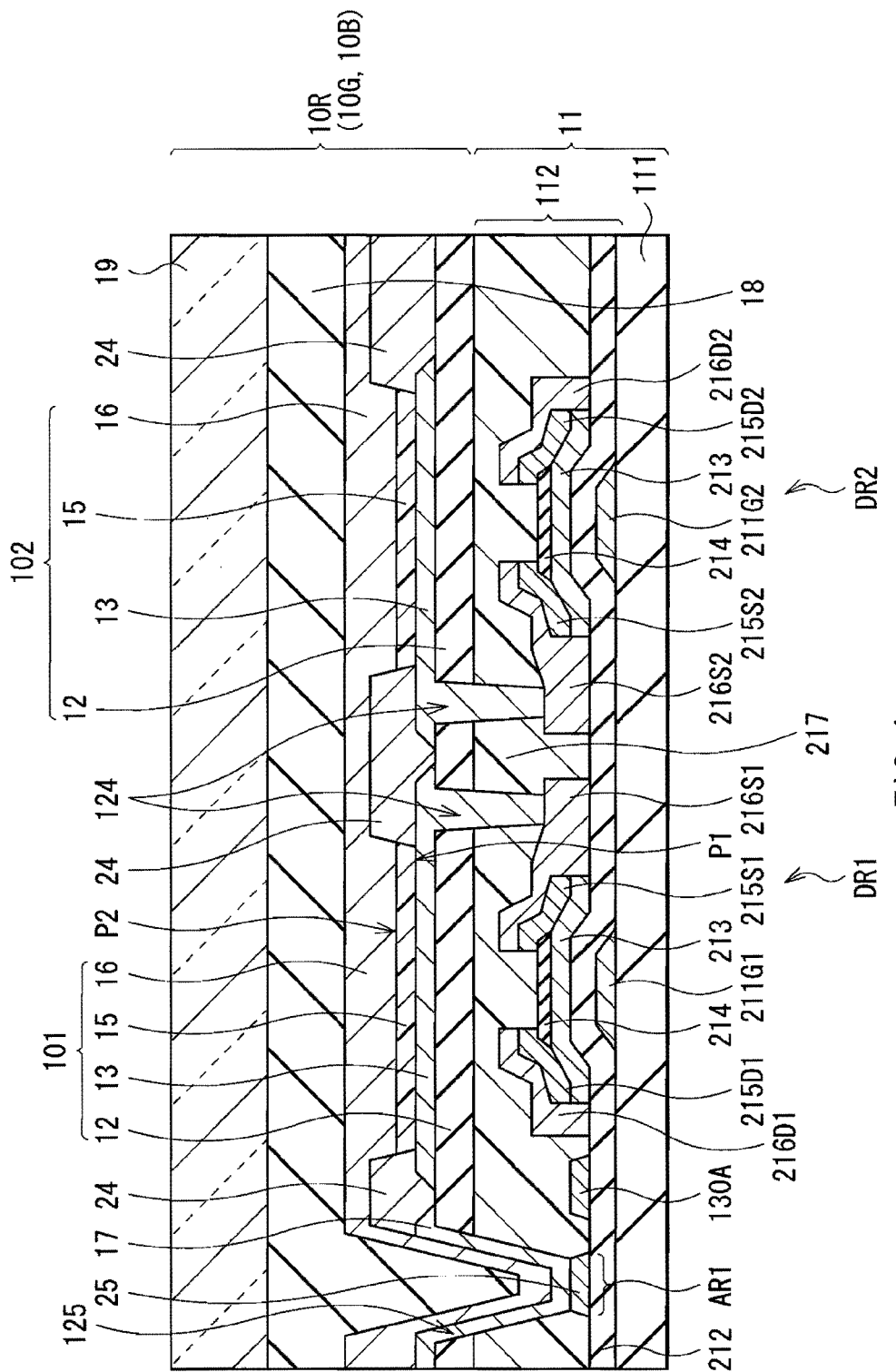
FIG. 4 is a cross-sectional view illustrating the configuration of a main part of the display region shown in FIG. 1.
Figure 5:
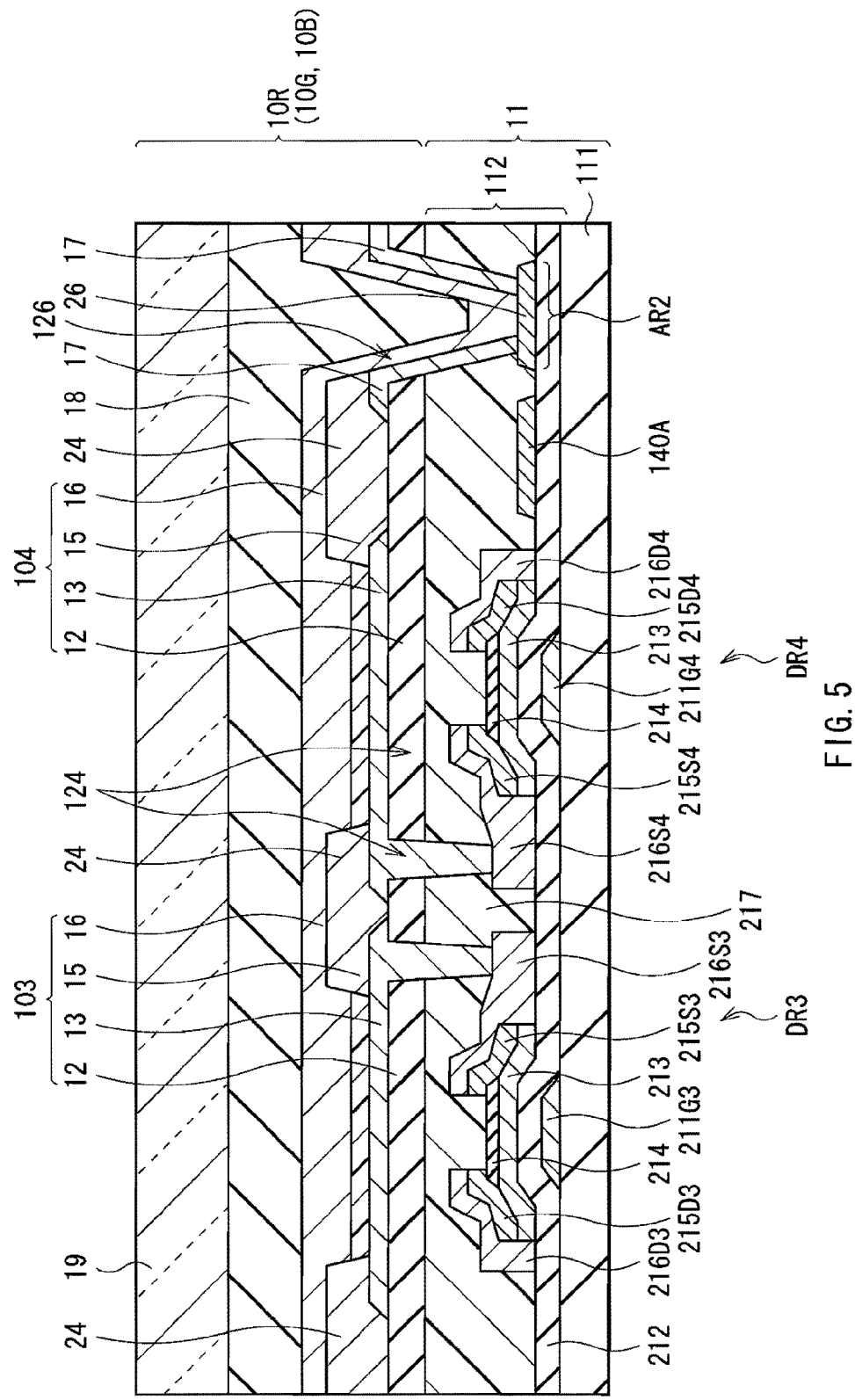
FIG. 5 is another cross-sectional view illustrating the configuration of the main part of the display region shown in FIG. 1.
Figure 6:
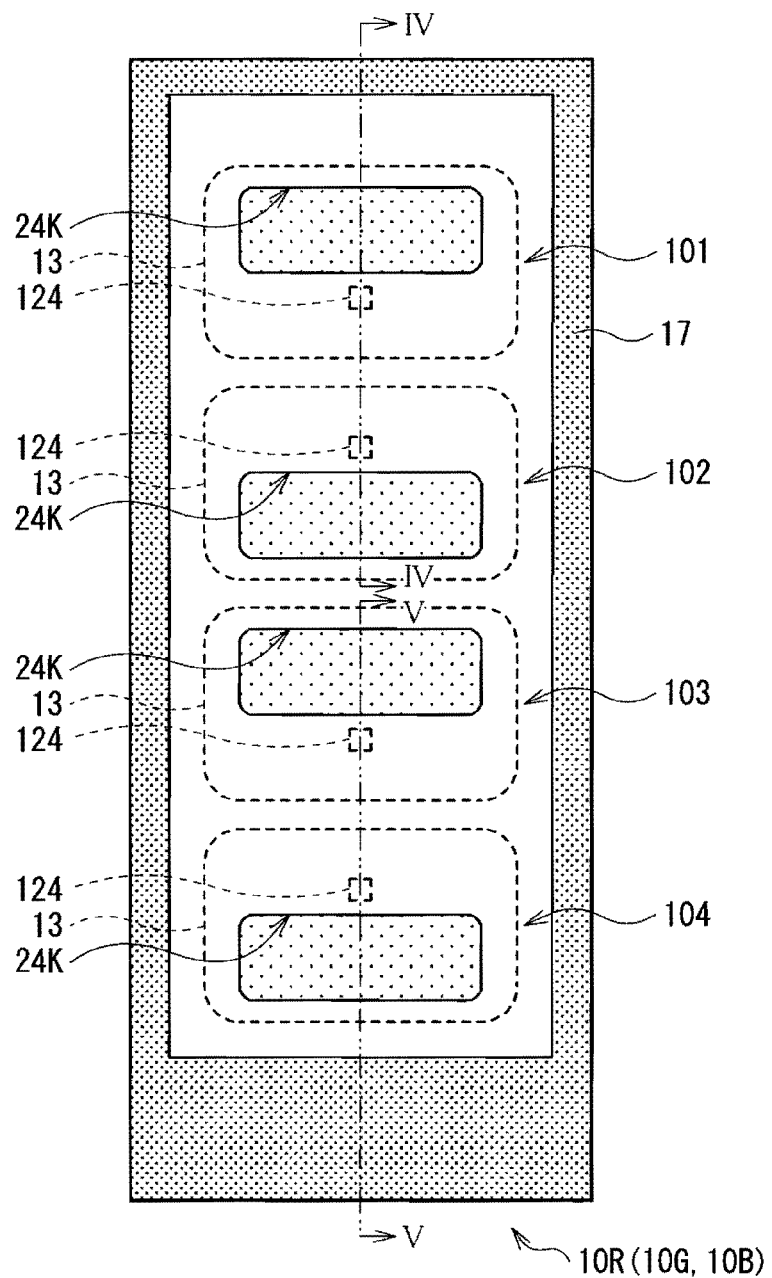
FIG. 6 is an enlarged plan view illustrating the configuration of an organic light emitting element shown in FIG. 3.

FIGS. 4 and 5 illustrate the cross-sectional configuration of a main part of the organic light emitting element 10R (or 10G or 10B) and the pixel driving circuit 150 shown in FIG. 3. For more detail, FIG. 4 is a cross-sectional view along line IV-IV shown in FIG. 3, and FIG. 5 is a cross-sectional view along line V-V shown in FIG. 3. FIG. 6 illustrates the plan configuration of a layer level including a first electrode layer 13 (will be described later) in the organic light emitting element 10R (or 10G or 10B) shown in FIG. 3.

In the organic light emitting element 10R (or 10G or 10B), the partial light emitting regions 101 to 104 are arranged on the base 11. The partial light emitting regions 101 to 104 are portions where light emission is generated. In each of the partial light emitting regions 101 to 104, an insulating layer 12, the first electrode layer 13 as an anode electrode, the organic layer 15 including a light emitting layer 15C which will be described later, and the second electrode layer 16 as a cathode electrode are stacked in this order from the base 11 side. Among them, the first electrode layer 13 and the organic layer 15 are separately provided for each of the partial light emitting regions 101 to 104, and the second electrode layer 16 is provided in common for the partial light emitting regions 101 to 104. On the partial light emitting regions 101 to 104, a protective film 18 and a sealing substrate 19 are arranged in order. In the partial light emitting regions 101 to 104, the first electrode layer 13 functions as a reflecting layer, and the second electrode layer 16 functions as a semi-transmissive reflecting layer. With the first electrode layer 13 and the second electrode layer 16, light generated in the light emitting layer 15C is multiply-reflected.

That is, the partial light emitting regions 101 to 104 have a resonator structure in which an end face on the light emitting layer 15C side of the first electrode layer 13 is regarded as a first end face P1, an end face on the light emitting layer 15C side of the second electrode layer 16 is regarded as a second end face P2, and an organic layer 15 is regarded as a resonator, and thus light generated in the light emitting layer 15C is resonated and taken out from the second end face P2 side. With such a resonator structure, the light generated in the light emitting layer 15C is multiply-reflected, and action as a kind of a narrowband filter is produced. Thereby, it is possible that a half width of a spectrum of the light to be taken out is reduced and the color purity is improved. Natural light entering from the sealing substrate 19 side is also attenuated with the multiply-reflection. By additionally using a retardation plate or a polarizing plate (not shown in the figure), reflectance of the natural light in the partial light emitting regions 101 to 104 may be extremely reduced.

It is preferable that a surface of the insulating layer 12 has a remarkably high planarity. The insulating layer 12 is provided with a fine connecting hole 124 in a part of a region corresponding to each of the partial light emitting regions 101 to 104 (refer to FIGS. 4 and 6). Moreover, the insulating layer 12 is provided with a connecting hole 125 in a position corresponding to the region AR1, and a connecting hole 126 in a position corresponding to the region AR2 (refer to FIGS. 4 and 5). Since the fine connecting hole 124 and the like are formed in the insulating layer 12, it is preferable that the insulating layer 12 is made of material having high pattern accuracy. Specifically, organic material such as polyimide is suitable.

The first electrode layer 13 functions as a reflecting layer as well. To increase the light emission efficiency, it is preferable that the first electrode layer 13 is made of material having reflectance as high as possible. The first electrode layer 13 has, for example, a thickness of 100 nm or more and 1000 nm or less, and is made of a single substance of a metal element such as silver (Ag), aluminum (Al), chrome (Cr), titanium (Ti), iron (Fe), cobalt (Co), nickel (Ni), molybdenum (Mo), copper (Cu), tantalum (Ta), tungsten (W), platinum (Pt), neodymium (Nd), or gold (Au), or alloy of those. The first electrode layer 13 covers a region corresponding to the partial light emitting regions 101 to 104 in the insulating layer 12, and fills the connecting hole 124. This leads to that the first electrode layer 13 is conducted to the driving transistors DR1 to DR4 (the metal layers 216S1 to 216S4 in the driving transistors DR1 to DR4) with the connecting hole 124 in between.

In a gap between each of the first electrode layers 13, an opening-defining insulating layer 24 of, for example, organic material such as polyimide is arranged. The opening-defining insulating layer 24 fills the gap, and covers an end face and a top surface of the periphery of the first electrode layer 13. The opening-defining insulating layer 24 maintains insulating properties between the first electrode layer 13 and the second electrode layer 16, and properly makes each light emitting region in the partial light emitting regions 101 to 104 into a desirable shape. The opening-defining insulating layer 24 includes four openings 24K corresponding to the partial light emitting regions 101 to 104, respectively. That is, light is emitted from the openings 24K.

Figure 7:
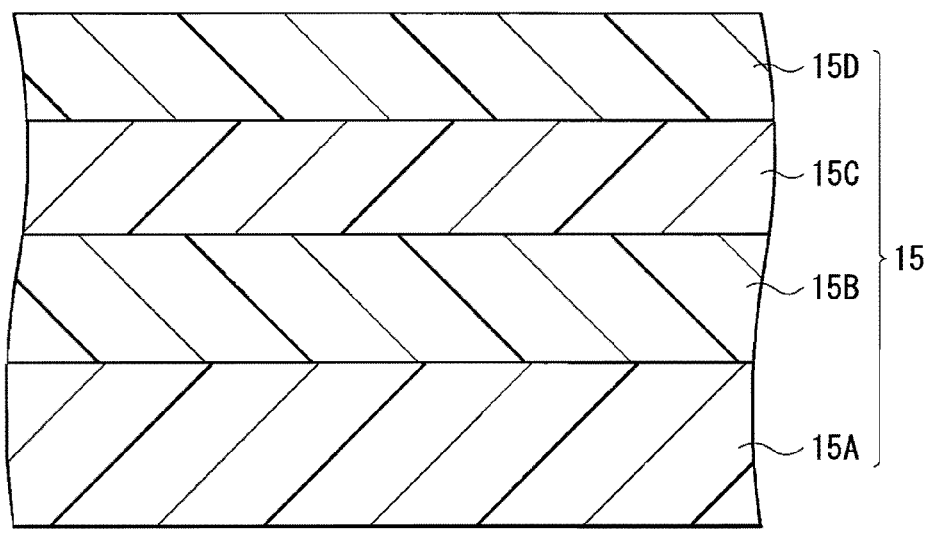
FIG. 7 is an enlarged cross-sectional view illustrating an organic layer shown in FIGS. 4 and 5.

The organic layer 15 covers a region separated with the opening 24K in the top surface of the first electrode layer 13 without a gap. As shown in FIG. 7, for example, the organic layer 15 has a configuration where a hole injecting layer 15A, a hole transporting layer 15B, a light emitting layer 15C, and an electron transporting layer 15D are stacked in this order from the first electrode layer 13 side. Among them, however, the layers except the light emitting layer 15C may be provided if necessary. FIG. 7 is an enlarged cross-sectional view of a part of the organic layer 15 shown in FIGS. 4 and 5.

The hole injecting layer 15A increases the hole injection efficiency, and serves as a buffer layer for preventing leakage. The hole transporting layer 15B increases the hole transportation efficiency to the light emitting layer 15C. In the light emitting layer 15C, recombination of a hole and an electron occurs by applying electric field, and thereby light is generated. The electron transporting layer 15D increases the electron transportation efficiency to the light emitting layer 15C. Between the electron transporting layer 15D and the second electrode layer 16, an electron injecting layer (not shown in the figure) of LiF, $Li_2O$, or the like may be provided.

The configuration of the organic layer 15 depends on a color of the emitted light from each of the organic light emitting elements 10R, 10G, or 10B. The hole injecting layer 15A in the organic light emitting element 10R has, for example, a thickness of 5 nm or more and 300 nm or less, and is made of 4,4',4"-tris(3-methyl phenyl phenylamino)triphenylamine (m-MTDATA) or 4,4',4"-tris(2-naphthyl phenyl amino) triphenylamine (2-TNATA). The hole transporting layer 15B in the organic light emitting element 10R has, for example, a thickness of 5 nm or more and 300 nm or less, and is made of bis [(N-naphthyl)-N-phenyl]benzidine (α-NPD). The light emitting layer 15C in the organic light emitting element 10R has, for example, a thickness of 10 nm or more and 100 nm or less, and is configured by mixing 2,6-bis [4-[N-(4-methoxyphenyl)-N-phenyl]aminostyryl]naphthalene-1,5-dicarbonitrile (BSN-BCN) of 40 volume % into 8-quinolinol aluminum complex ($Alq_3$). The electron transporting layer 15D in the organic light emitting element 10R has, for example, a thickness of 5 nm or more and 300 nm or less, and is made of $Alq_3$.

The hole injecting layer 15A in the organic light emitting element 10G has, for example, a thickness of 5 nm or more and 300 nm or less, and is made of m-MTDATA or 2-TNATA. The hole transporting layer 15B in the organic light emitting element 10G has, for example, a thickness of 5 nm or more and 300 nm or less, and is made of α-NPD. The light emitting layer 15C in the organic light emitting element 10G has, for example, a thickness of 10 nm or more and 100 nm ore less, and is configured by mixing coumarin 6 of 3 volume % into $Alq_3$. The electron transporting layer 15D in the organic light emitting element 10G has, for example, a thickness of 5 nm or more and 300 nm or less, and is made of $Alq_3$.

The hole injecting layer 15A in the organic light emitting element 10B has, for example, a thickness of 5 nm or more and 300 nm or less, and is made of m-MTDATA or 2-TNATA. The hole transporting layer 15B in the organic light emitting element 10B has, for example, a thickness of 5 nm or more and 300 nm or less, and is made of α-NPD. The light emitting layer 15C in the organic light emitting element 10B has, for example, a thickness of 10 nm or more and 100 nm or less, and is made of spiro 6φ. The electron transporting layer 15D in the organic light emitting element 10B has, for example, a thickness of 5 nm or more and 300 nm or less, and is made of $Alq_3$.

The second electrode layer 16 has, for example, a thickness of 5 nm or more and 50 nm or less, and is made of a single substance of a metal element such as aluminum (Al), magnesium (Mg), calcium (Ca), or natrium (Na), or alloy of those. Among them, alloy of magnesium and silver (MgAg alloy) or alloy of aluminum (Al) and lithium (Li) (AlLi alloy) is preferable. The second electrode layer 16 is, for example, provided in common for all of the organic light emitting elements 10R, 10G, and 10B, and faces the first electrode layer 13 in each of the organic light emitting elements 10R, 10G, and 10B. Moreover, the second electrode layer 16 not only covers the organic layer 15, but also covers the opening-defining insulating layer 24.

The metal layer 17 surrounds the partial light emitting regions 101 to 104, and functions as an auxiliary electrode layer compensating voltage drop in the second electrode layer 16 as a main electrode. The metal layer 17 is, for example, preferably made of metal material having high conductivity and being the same type as that of the first electrode layer 13. In terms of improvement in the opening ratio, it is preferable that the metal layer 17 has a width as small as possible (occupied area as small as possible). Moreover, the metal layer 17 covers at least an inner wall of the connecting hole 125 in the region AR1 and the connecting hole 126 in the region AR2. In the regions AR1 and AR2, the metal layer 17 is covered with the second electrode layer 16. Therefore, the second electrode layer 16 is electrically connected to the metal layer 17.

In the case where there is no metal layer 17, due to voltage drop according to each distance from a power source (not shown in the figure) to the organic light emitting elements 10R, 10G, and 10B, electric potential of the second electrode layer 16 connected to the common power supply line GND (refer to FIG. 2) does not become uniform among the organic light emitting elements 10R, 10G, and 10B, and this likely causes an obvious variation. Such a variation of the electric potential of the second electrode layer 16 is not preferable, since this may be the reason of the luminance non-uniformity in the display region 110. Even in the case where the display device has a large screen, the metal layer 17 functions to minimize the voltage drop from the power source to the second electrode layer 16, and suppress generation of such luminance non-uniformity.

As shown in FIGS. 4 and 5, the organic light emitting element 10R (or 10G or 10B) further includes the protective film 18 of silicon nitride (SiNx) or the like covering the second electrode layer 16, and the sealing substrate 19 arranged on the protective film 18. The sealing substrate 19 seals the partial light emitting regions 101 to 104 in cooperation with the protective film 18, an adhesive layer (not shown in the figure), and the like, and is made of material such as transparent glass transmitting light generated in the partial light emitting regions 101 to 104.

Figure 8:
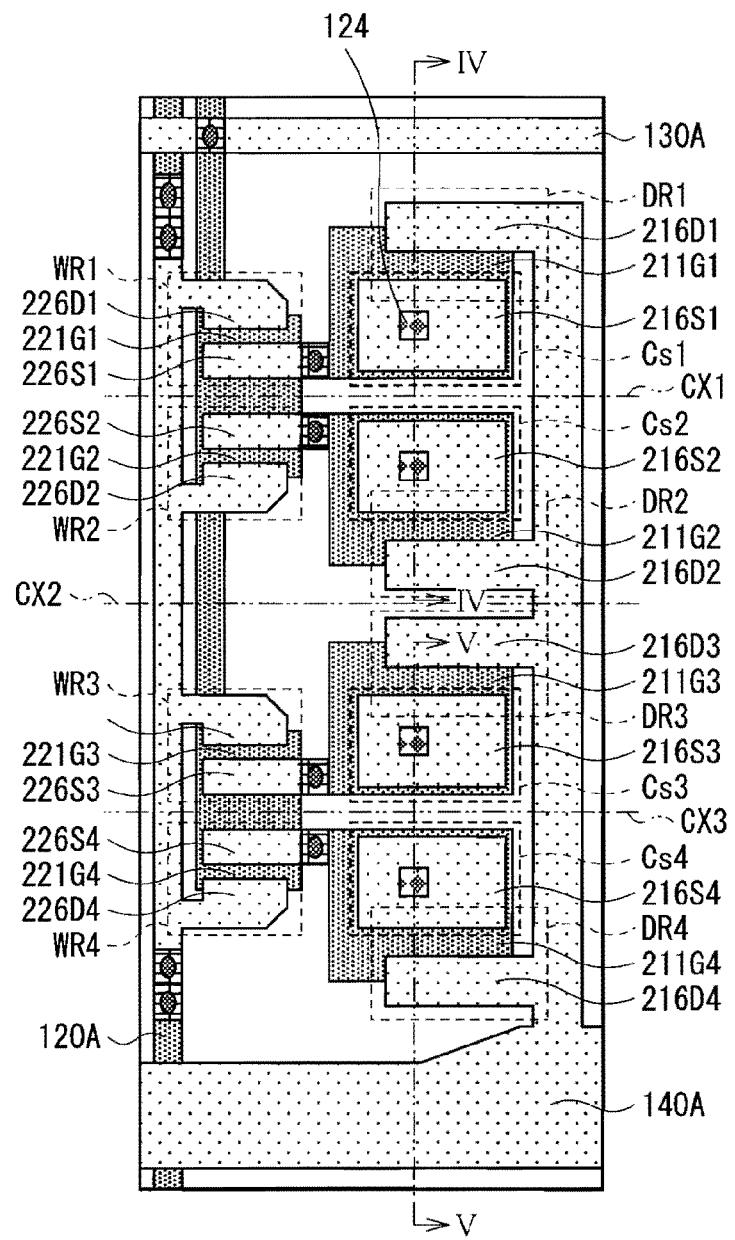
FIG. 8 is a plan view illustrating the configuration of a pixel-driving-circuit forming layer shown in FIGS. 4 and 5.

Next, with reference to FIGS. 4, 5, and 8, the detailed configuration of the base 11 will be described. In the base 11, a pixel-driving-circuit forming layer 112 including the pixel driving circuit 150 is arranged on the substrate 111 of glass, silicon (Si), wafer, resin, or the like. FIG. 8 is a schematic view illustrating the plan configuration of the pixel driving circuit 150 arranged in the pixel-driving-circuit forming layer 112, and corresponds to the plan configuration view of the organic light emitting element 10R (or 10G or 10B) shown in FIG. 6. The cross-section along line IV-IV shown in FIG. 8 corresponds to FIG. 4. The cross section along line V-V shown in FIG. 8 corresponds to FIG. 5.

Next, the detailed configuration of the pixel driving circuit 150 will be described. In the pixel-driving-circuit forming layer 112, the scanning line 130A and the power supply line 140A extending parallel to each other, and the signal line 120A extending in a direction orthogonal to the scanning line 130A and the power supply line 140A are arranged. Moreover, in the pixel-driving-circuit forming layer 112, the writing transistors WR1 to WR4 and the driving transistors DR1 to DR4 are arranged parallel to each other along the extending direction of the signal line 120A. The drain electrode and the source electrode in each of the writing transistors WR1 to WR4 and the driving transistors DR1 to DR4 are aligned along the extending direction of the signal line 120A.

On the surface of the substrate 111, the metal layers 211G1 to 211G4 which serve as gate electrodes in the driving transistors DR1 to DR4, the metal layers 221G1 to 221G4 (FIG. 8) which serve as gate electrodes in the writing transistors WR1 to WR4, and the signal line 120A (FIG. 8) are arranged as the metal layers in a first layer level. The metal layers 211G1 to 211G4 and 221G1 to 221G4, and the signal line 120A are covered with a gate insulating film 212 of silicon nitride, silicon oxide, or the like. The metal layers 221G1 to 221G4 are connected to one another, and constitute an integrated metal film.

In the driving transistors DR1 to DR4, a channel layer 213 of a semiconductor thin film such as amorphous silicon is arranged in a region corresponding to each of the metal layers 211G1 to 211G4. On the channel layer 213, a channel protective film 214 having insulating properties is arranged so as to occupy a channel region being a middle region of the channel layer 213. On the both sides of the channel protective film 214, n-type semiconductor layers 215D1 to 215D4 and n-type semiconductor layers 215S1 to 215S4 of n-type semiconductor such as n-type amorphous silicon are arranged. These n-type semiconductor layers 215D1 to 215D4 and the n-type semiconductor layers 215S1 to 215S4 are separated from each other by the channel protective film 214, and end faces of the n-type semiconductor layers 215D1 to 215D4 and the n-type semiconductor layers 215S1 to 215S4 are apart from each other with the channel region in between. Moreover, metal layers 216D1 to 216D4 being drain electrodes and the metal layers 216S1 to 216S4 being source electrodes are arranged as the metal layers in a second layer level, and cover the n-type semiconductor layers 215D1 to 215D4 and the n-type semiconductor layers 215S1 to 215S4, respectively. The metal layers 216D1 to 216D4 have electric potential equal to one another, and the metal layers 216S1 to 216S4 have electric potential equal to one another.

Similarly, in the writing transistors WR1 to WR4, a channel layer (not shown in the figure) of a semiconductor thin film such as amorphous silicon and fine crystal silicon is arranged in a region corresponding to each of the metal layers 221G1 to 221G4 on the gate insulating film 212. On the channel layer, a channel protective film (not shown in the figure) having insulating properties is arranged, and occupies a channel region being the middle region of the channel layer. On the both sides of the channel protective film, a pair of n-type semiconductor layers (not shown in the figure) of n-type semiconductor such as n-type amorphous silicon are arranged. The pair of n-type semiconductor layers are separated from each other with the channel protective film, and end faces of the pair of n-type semiconductor layers are apart from each other with the channel region in between. Moreover, metal layers 226D1 to 226D4 being drain electrodes and the metal layers 226S1 to 226S4 being source electrodes are provided as the metal layers in the second layer level, and cover the pair of n-type semiconductor layers. The metal layers 226D1 to 226D4 have electric potential equal to one another, and the metal layers 226S1 to 226S4 have electric potential equal to one another.

The metal layers 216D1 to 216D4 and 226D1 to 226D4, and the metal layers 216S1 to 216S4 and 226S1 to 226S4 as the metal layers in the second layer level have the configuration where, for example, a titanium (Ti) layer, an aluminum (Al) layer, and a titanium layer are stacked in this order. In addition to these metal layers, the metal layers 25 and 26, the scanning line 130A, and the power supply line 140A (FIG. 8) are provided as the metal layers in the second layer level. The metal layer 25 is ring-shaped, and the metal layer 26 is island-shaped in the plan configuration. Both of the metal layers 25 and 26 are electrically insulated from the other metal layers in the second layer level. As a whole, the metal layers in the second layer level are covered with a passivation film 217 of silicon nitride or the like. Here, although the driving transistors DR1 to DR4 and the writing transistors WR1 to WR4 having an inverted staggered structure (so-called bottom-gate type) are described, these may have a staggered structure (so-called top-gate type). The signal line 120A may be arranged in the second layer level, if it is to be arranged in a region except the intersection of the scanning line 130A and the power supply line 140A.

The drain electrodes or the source electrodes in any pair of writing transistors WR1 to WR4 which are immediately adjacent to each other and in any pair of driving transistors DR1 to DR4 which are immediately adjacent to each other are immediately adjacent to each other. Here, in particular, the drain electrodes in the pair of transistors which are immediately adjacent to each other are line-symmetrically arranged, and the source electrodes in the pair of transistors which are immediately adjacent to each other are line-symmetrically arranged with respect to the same axis orthogonal to the alignment direction (that is, the extending direction of the signal line 120A) of the drain electrodes and the source electrodes. For example, the metal layer 226D1 and the metal layer 226S1 in the writing transistor WR1, and the metal layer 226D2 and the metal layer 226S2 in the writing transistor WR2 are symmetrically arranged with respect to an axis CX1 along the scanning line 130A. The metal layer 226D2 and the metal layer 226S2 in the writing transistor WR2, and the metal layer 226D3 and the metal layer 226S3 in the writing transistor WR3 are symmetrically arranged with respect to an axis CX2 along the scanning line 130A. Moreover, the metal layer 226D3 and the metal layer 226S3 in the writing transistor WR3, and the metal layer 226D4 and the metal layer 226S4 in the writing transistor WR4 are symmetrically arranged with respect to an axis CX3 along the scanning line 130A. With such a configuration, in each in the writing transistors WR1 to WR4, probability of a short circuit caused by a mixed foreign matter or the like between the metal layers 226D1 to 226D4 and the metal layers 226S1 to 226S4 is reduced. Similarly, between the writing transistors WR1 to WR4, the probability of the short circuit caused by a mixed foreign matter or the like is reduced. In particular, in the writing transistor WR1 and the writing transistor WR2 arranged closest to each other, the distance between the metal layer 226D1 and the metal layer 226S1 and the distance between the metal layer 226D2 and the metal layer 226S2 are set larger than the distance between the metal layer 226S1 and the metal layer 226S2. Similarly, in the writing transistor WR3 and the writing transistor WR4 arranged closest to each other, the distance between the metal layer 226D3 and the metal layer 226S3 and the distance between the metal layer 226D4 and the metal layer 226S4 are set larger than the distance between the metal layer 226S3 and the metal layer 226S4. With such an arrangement, it is possible that the area occupied by the writing transistors WR1 to WR4 is reduced, while suppressing generation of the short circuit caused by a mixed foreign matter or the like. The positional relationship between the driving transistors DR1 to DR4 is the same as that between the writing transistors WR1 to WR4 described above. The operational effects (probability of the short circuit caused by a mixed foreign matter or the like is reduced) obtained with such a configuration are also the same as those in the case of the writing transistors WR1 to WR4.

The display device is manufactured, for example, as described below. Hereinafter, a method of manufacturing the display device according to the embodiment will be described with reference to FIGS. 4, 5, 8, 9A, 9B, 10A, 10B, 11A, and 11B. A method of manufacturing the organic light emitting elements 10R, 10G, and 10B will be also described below. FIGS. 9A, 9B, 10A, 10B, 11A, and 11B illustrate the method of manufacturing the display device in processing order, and correspond to the cross-sectional views of FIGS. 4 and 5.

Figure 9A:
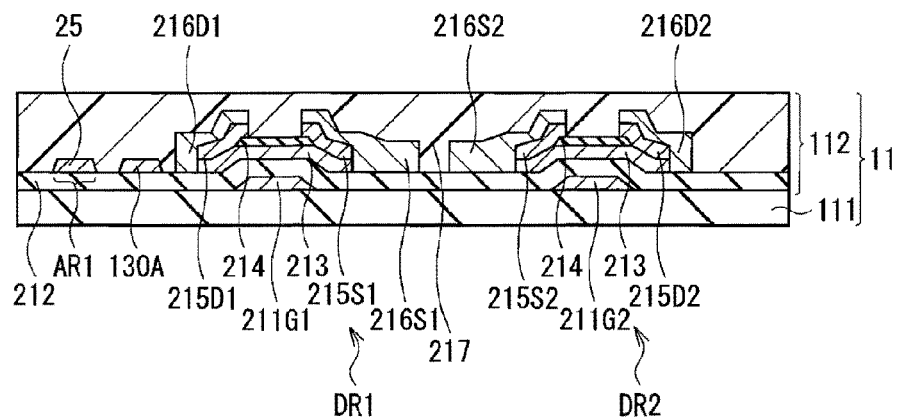
FIGS. 9A and 9B are cross-sectional views illustrating a step in a method of manufacturing the display device shown in FIG. 1.
Figure 9B:
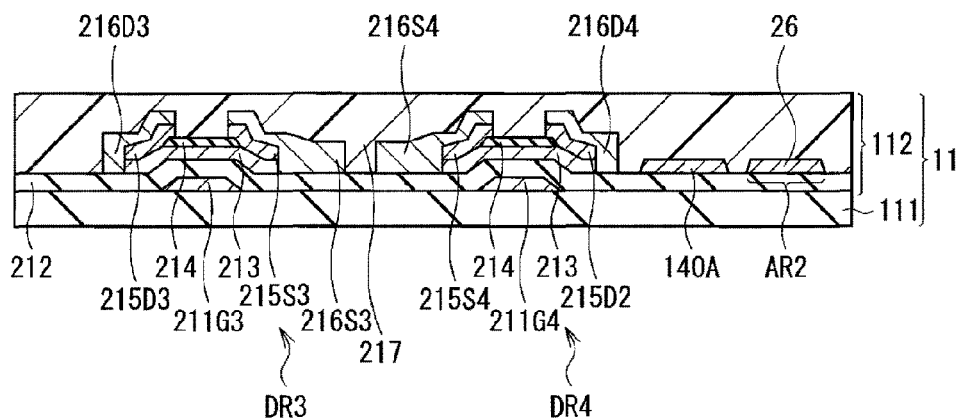

On the substrate 111 of the above-described material, the pixel-driving-circuit forming layer 112 including the pixel driving circuit 150 is formed. Specifically, a metal film is formed on the substrate 111, for example, by sputtering. Then, the metal film is patterned, for example, by photolithography method, dry-etching, or wet-etching. Thereby, as shown in FIGS. 8, 9A, and 9B, the metal layers 211G1 to 211G4 and 221G1 to 221G4, and the signal line 120A (refer to FIG. 8) as the metal layers in the first layer level are formed on the substrate 111. Next, the whole surface is covered with the gate insulating film 212. On the gate insulating film 212, the channel layer, the channel protective film, the n-type semiconductor layer, and the metal layers 216D1 to 216D4 and 226D1 to 226D4 and the metal layers 216S1 to 216S4 and 226S1 to 226S4 as the metal layers in the second layer level are formed in this order in predetermined shapes. Thereby, the driving transistors DR1 to DR4 and the writing transistors WR1 to WR4 are obtained.

In the case where the channel layer of fine crystal silicon is formed, it is preferable that a semiconductor thin film of amorphous silicon is deposited, and then laser light is irradiated to the semiconductor thin film so that the amorphous silicon is crystallized into a crystal grain having size of nanometer-order. In that case, it is preferable that the laser light is irradiated while scanning along the direction orthogonal to the arrangement direction of the driving transistors DR1 to DR4 and the writing transistors WR1 to WR4 (that is, the extending direction of the scanning line 130A). This is because, with such an operation, non-uniformity of crystallization degree between the driving transistors DR1 to DR4, and between the writing transistors WR1 to WR4 hardly occurs, and this results in that deterioration of display characteristics hardly occurs. On the other hand, when the laser light scans along the arrangement direction of the driving transistors DR1 to DR4 and the writing transistors WR1 to WR4 (that is, the extending direction of the signal line 120A), inconvenience occurs as follows. Specifically, the non-uniformity of the crystallization degree in the obtained fine crystal silicon likely occurs between the case where the laser light scans from the drain electrode (the metal layers 216D1 to 216D4 and 226D1 to 226D4) side, and the case where the laser light scans from the source electrode (the metal layers 216S1 to 216S4 and 226S1 to 226S4) side. Therefore, as described above, it is preferable that the scanning direction of the laser light is set as the direction orthogonal to the arrangement direction of the drain electrodes and the source electrodes.

With the formation of the metal layers 216D1 to 216D4 and 226D1 to 226D4 and the metal layers 216S1 to 216S4 and 226S1 to 226S4, the metal layers 25 and 26, the scanning line 130A, and the power supply line 140A are formed. That is, the metal layers 25 and 26, the scanning line 130A, and the power supply line 140A are also the metal layers in the second layer level. At that time, the metal layers 221G1 to 221G4 and the scanning line 130A are connected, the metal layers 226D1 to 226D4 and the signal line 120A are connected, and the metal layers 226S1 to 226S4 and the metal layers 211G1 to 221G4 are connected. Then, by covering the whole with the passivation film 217, the pixel driving circuit 150 is completed.

Figure 10A:
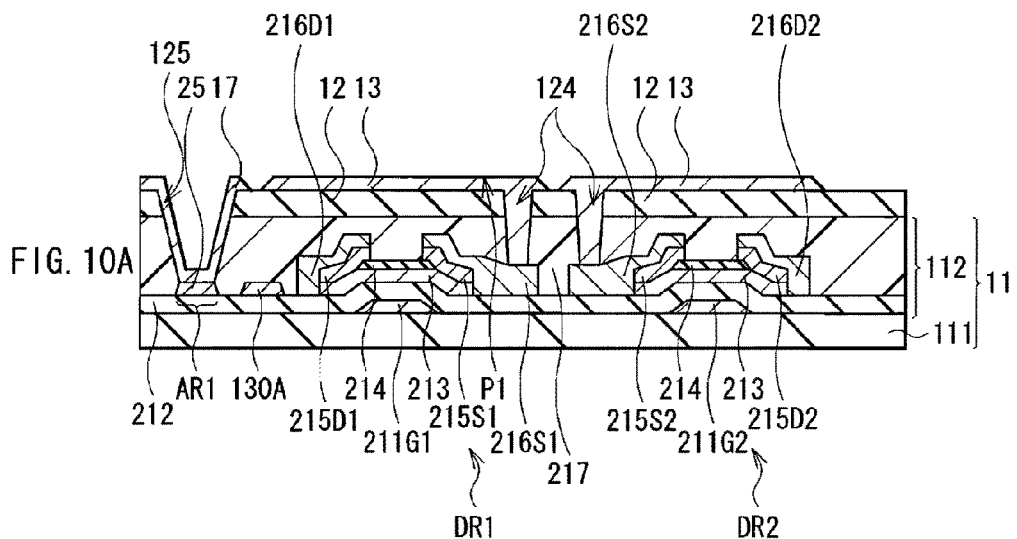
FIGS. 10A and 10B are cross-sectional views illustrating a step subsequent to FIGS. 9A and 9B.
Figure 10B:
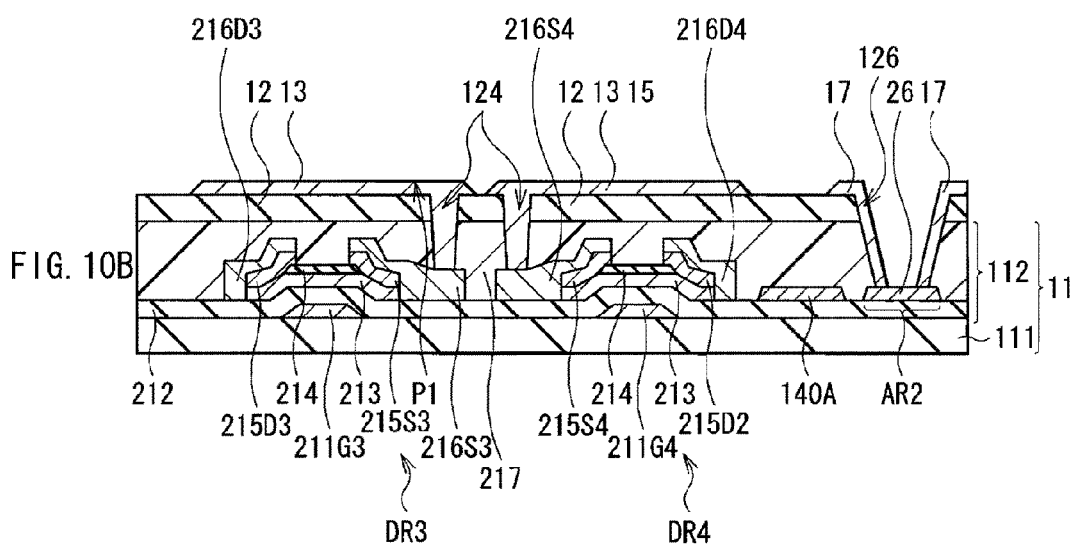

As shown in FIGS. 10A and 10B, after forming the pixel driving circuit 150, the insulating layer 12 is formed. Specifically, to planarize the surface of the insulating layer 12, photosensitive resin containing, for example, polyimide as the major component is applied over the whole surface, and exposure and development are performed. At that time, the connecting hole 124 reaching the top surface of the metal layers 216S1 to 216S4, the connecting hole 125 reaching the top surface of the metal layer 25, and the connecting hole 126 reaching the top surface of the metal layer 26 are formed in certain positions. Then, the insulating layer 12 is burned if necessary.

After forming the connecting holes 124 and 126, and the connecting hole 125 in the insulating layer 12, as shown in FIGS. 10A and 10B, the first electrode layer 13 and the metal layer 17 of the above-described material are formed. Specifically, the metal film made of constituent material of the first electrode layer 13 and the metal layer 17 is deposited on the whole surface, for example, by sputtering. After that, a resist pattern (not shown in the figure) selectively covering the metal film is formed by using a predetermined mask. The exposed region in the metal film is etched by using the resist pattern as a mask, and thereby the first electrode layer 13 and the metal layer 17 are obtained. At that time, the first electrode layer 13 fills the connecting hole 124, and selectively covers the region corresponding to the partial light emitting regions 101 to 104 in the surface of the insulating layer 12. At this time, since the surface of the insulating layer 12 is planarized, the top surface of the first electrode layer 13 also has superior planarity.

The metal layer 17 covers at least the inner wall of the connecting hole 126 and the connecting hole 125. It is desirable that the metal layer 17 is formed simultaneously with the first electrode layer 13, and made of the same material as the first electrode layer 13.

Next, as shown in FIGS. 11A and 11B, the opening-defining insulating layer 24 is formed. The opening-defining insulating layer 24 fills between the first electrode layer 13 and the metal layer 17, and covers the end face and the top surface of the periphery of the first electrode layer 13. The hole injecting layer 15A, the hole transporting layer 15B, the light emitting layer 15C, and the electron transporting layer 15D made of the above-described predetermined material and having a predetermined thickness are stacked in this order, for example, by evaporation method, and cover a region in the first electrode layer 13 which is not covered with the opening defining insulating layer 24. Thereby, the organic layer 15 is formed. Moreover, the second electrode layer 16 facing the first electrode layer 13 with the organic layer 15 in between, and covering the whole surface of the metal layer 17 is formed. Thereby, the partial light emitting regions 101 to 104 are completed. In the partial light emitting regions 101 to 104 formed in this way, since the surface of the insulating layer 12 has remarkably high planarity, the end face P1 on the light emitting layer 15C side of the first electrode layer 13 and the end face P2 on the light emitting layer 15C side of the second electrode layer 16 are planarized, and variation in the thickness of the organic layer 15 becomes remarkably small.

After this, the protective film 18 of the above-described material covering the partial light emitting regions 101 to 104 is formed. Finally, the adhesive layer is formed on the protective film 18, and the protective film 18 and the sealing substrate 19 are adhered with the adhesive layer in between. Thereby, the display device is completed.

In the display device obtained in this way, the scanning signal is supplied to each pixel from the scanning line driving circuit 130 through the gate electrodes (the metal layers 221G1 to 221G4) in the writing transistors WR1 to WR4, and the image signal from the signal line driving circuit 120 is retained in retention capacities Cs1 to Cs4 through the writing transistors WR1 to WR4. Meanwhile, the power supply line driving circuit 140 supplies the first electric potential higher than the second electric potential to each power supply line 140A in synchronization with the line-by-line scanning by the scanning line driving circuit 130. Thereby, a conducting state of the driving transistors DR1 to DR4 is selected. A driving current Id is injected to each of the organic light emitting elements 10R, 10G, and 10B, and light emission is generated by recombination of a hole and an electron. This light is multiply-reflected between the first electrode layer 13 and the second electrode layer 16, and transmits the second electrode layer 16, the protective film 18, and the sealing substrate 19. Then, the light is taken out.

As described above, in the embodiment, the partial light emitting regions 101 to 104 are provided for each of the organic light emitting elements 10R, 10G, and 10B, and the writing transistors WR1 to WR4 and the driving transistors DR1 to DR4 are provided corresponding to each of the partial light emitting regions 101 to 104. Thus, even in the case where a defect occurs in a part of the partial light emitting regions 101 to 104, the partial light emitting regions 101 to 104 as a whole are prevented from a dark spot by adjusting and utilizing the normal partial light emitting regions 101 to 104 except the defective ones.

Moreover, the metal layers 226D1 to 226D4 and the metal layers 226S1 to 226S4 in the writing transistors WR1 to WR4 have electric potential equal to one another, and the distance between the metal layer 226S1 and the metal layer 226S2 is set smaller than the distance between the metal layer 226S1 and the metal layer 226D1 and the distance between the metal layer 226S2 and the metal layer 226D2. Alternatively, the distance between the metal layer 226S3 and the metal layer 226S4 is set smaller than the distance between the metal layer 226S3 and the metal layer 226D3 and the distance between the metal layer 226S4 and the metal layer 226D4. Therefore, occurrence of a semi-dark spot defect is suppressed. In particular, in the pair of writing transistors immediately adjacent each other in the writing transistors WR1 to WR4, the metal layers 226D1 to 226D4 and the metal layers 226S1 to 226S4 are symmetrically arranged with respect to the same axis orthogonal to the extending direction of the signal line 120A. Thereby, the high-level integration is achieved.

Similarly, the metal layers 216D1 to 216D4 and the metal layers 216S1 to 216S4 in the driving transistors DR1 to DR4 have electric potential equal to one another, and the distance between the metal layer 216S1 and the metal layer 216S2 is set smaller than the distance between the metal layer 216S1 and the metal layer 216D1 and the distance between the metal layer 216S2 and the metal layer 216D2. Alternatively, the distance between the metal layer 216S3 and the metal layer 216S4 is set smaller than the distance between the metal layer 216S3 and the metal layer 216D3 and the distance between the metal layer 216S4 and the metal layer 216D4. Therefore, occurrence of a bright spot defect is suppressed. In particular, in the pair of driving transistors immediately adjacent to each other in the driving transistors DR1 to DR4, the metal layers 216D1 to 216D4 and the metal layers 216S1 to 216S4 are symmetrically arranged with respect to the same axis orthogonal to the extending direction of the signal line 120A. Thereby, the high-level integration is achieved.

Moreover, all of the metal layers 226D1 to 226D4, the metal layers 226S1 to 226S4, the metal layers 216D1 to 216D4, and the metal layers 216S1 to 216S4 are arranged in the same layer level. Therefore, easier manufacturing and more compact configuration are realized.

Hereinbefore, although the present invention is described with the embodiment, it is not limited to the embodiment and various modifications may be made. For example, in the embodiment, although organic material such as photosensitive resin is exemplified as the material for the insulating layer 12, and the manufacturing method using that material is described, it is not limited to that. For example, the insulating layer 12 may be configured with inorganic material such as silicon oxide ($SiO_2$) and silicon nitride ($Si_3N_4$). In that case, for example, after an insulating film is formed on the base 11 by, for example, evaporation method or the like, the connecting hole 124 is formed by dry etching such as fluorine gas etching and ion beam etching with a predetermined mask.

In the embodiment, the first electrode layer 13, the organic layer 15, and the second electrode layer 16 are stacked in this order on the base 11, and the light is taken out from the second electrode layer 16 side. However, it is also possible that the second electrode layer 16, the organic layer 15, and the first electrode layer 13 are stacked in this order from the base 11 side, and the light is taken out from the base 11 side.

In the embodiment, for example, although the case where the first electrode layer 13 is used as an anode electrode, and the second electrode layer 16 is used as a cathode electrode is described, it is also possible that the first electrode layer 13 is used as a cathode electrode, and the second electrode layer 16 is used as an anode electrode. Even in this case, it is also possible that the second electrode layer 16, the organic layer 15, and the first electrode layer 13 are stacked in this order from the base 11 side on the base 11, and the light is taken out from the base 11 side.

In the embodiment, although the layer configuration of the organic light emitting elements 10R, 10G, and 10B is specifically described as above, it is not always necessary to include all of the layers, and other layers may further be included. For example, between the first electrode layer 13 and the organic layer 15, a hole injecting thin film layer of chrome oxide (III) ($Cr_2O_3$), ITO (indium-tin oxide: oxide mixed film of indium (In) and tin (Sn)), or the like may be provided.

In the embodiment, although the case of an active matrix display device is described, the present invention is also applicable to a passive matrix display device. The configuration of the pixel driving circuit for driving the active matrix is not limited to the configuration described in the embodiment, and a capacitor and a transistor may be optionally added. In that case, according to a change in the pixel driving circuit, a necessary driving circuit may be added in addition to the above-described signal line driving circuit 120, the scanning line driving circuit 130, and the power supply line driving circuit 140.

Moreover, in the embodiment, although the case where both of the writing transistors and the driving transistors are aligned along one direction is described, only one type of the writing transistors and the driving transistors may be symmetrically arranged along one direction in the present invention. However, in the case of the organic light emitting element, it is necessary to supply current having a predetermined magnitude or more to each of the partial light emitting regions to obtain the high light emission efficiency. Therefore, to reduce electric resistance, the area occupied by the drain electrode and the source electrode in the driving transistor is necessarily kept to some extent. Moreover, to extend the area occupied by each of the light emitting regions and to improve the opening ratio, it is inevitable that the area occupied by the drain electrode and the source electrode in the driving transistor is further extended. On the other hand, in the writing transistor, large current as in the driving transistor is unnecessary. Even if the area occupied by the drain electrode and the source electrode is reduced, improvement in the light emission efficiency and the opening ratio is hardly disturbed. For this reason, it is preferable that the area occupied by the writing transistor is reduced to improve the light emission efficiency and the opening ratio. However, reducing the area occupied by the writing transistor may lead to an increase in risk of generation of the short circuit between electrodes caused by a mixed foreign matter or the like. Thus, in the case of the organic light emitting element, it is desirable that at least the driving transistors are aligned along one direction, and the drain electrodes and source electrodes in the driving transistors immediately adjacent to each other are arranged symmetrically to one another along the direction.

Moreover, in the embodiment, although the organic light emitting element is exemplified and described as the display element, the present invention is not limited to this. For example, the present invention is also applicable to other display elements such as a liquid crystal display element.

The present application contains subject matter related to that disclosed in Japanese Priority Patent Application JP 2008-118891 filed in the Japan Patent Office on Apr. 30, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
    a display element including a plurality of sub-elements connected to respective retention capacities;
    a plurality of writing transistors respectively arranged corresponding to the plurality of sub-elements in a region of the display element, the plurality of writing transistors writing an image signal to the retention capacities; and
    a plurality of driving transistors driving respective sub-elements based on the image signal written through the plurality of writing transistors,
    wherein,
        in a plan view layout of the region of the display element,
            at least one of the writing transistors and the driving transistors are aligned along a source-drain alignment direction,
            respective drain and source electrodes in at least one of a pair of immediately adjacent driving transistors and a pair of immediately adjacent writing transistors are disposed line-symmetrically with respect to an axis extending along a scanning line;
            for at least one of the pair of immediately adjacent writing transistors and the pair of immediately adjacent driving transistors, respective source electrodes within the pair are disposed closer to each other than are electrodes of a different type,
            drain electrodes of the pair of immediately adjacent writing transistors are disposed in between the drain electrodes of the pair of immediately adjacent driving transistors; and
            the writing transistors and the driving transistors are disposed parallel to each other along a signal line extending in a direction orthogonal to the scanning line.

2. The display device according to claim 1, wherein drain electrodes in a pair of transistors which are immediately adjacent to each other have a common electric potential, and source electrodes in a pair of transistors which are immediately adjacent to each other have a common electric potential.

3. The display device according to claim 1, wherein source electrodes and drain electrodes in at least one of the writing transistors and the driving transistors are arranged in a same layer level.

4. The display device according to claim 1, wherein gate electrodes in the writing transistors are electrically connected to each other.

* * * * *